United States Patent
Kawakami et al.

[11] Patent Number: 5,968,858
[45] Date of Patent: *Oct. 19, 1999

[54] INSULATING PASTE AND THICK-FILM MULTI-LAYERED PRINTED CIRCUIT USING THE PASTE

[75] Inventors: Hiromichi Kawakami, Moriyama; Hiroji Tani, Nagokakyo, both of Japan

[73] Assignee: Murata Manufacturing Co., Ltd., Japan

[*] Notice: This patent is subject to a terminal disclaimer.

[21] Appl. No.: 08/956,208

[22] Filed: Oct. 22, 1997

Related U.S. Application Data

[62] Division of application No. 08/627,444, Apr. 4, 1996, Pat. No. 5,766,741.

[30] Foreign Application Priority Data

Apr. 4, 1995 [JP] Japan ................................. 7-79058

[51] Int. Cl.$^6$ ................................. C03C 8/14; C03C 8/16
[52] U.S. Cl. ................................. 501/14; 501/15; 501/20; 501/21; 501/65; 501/66; 428/210
[58] Field of Search ................................. 501/65, 14, 15, 501/20, 21, 66; 428/210

[56] References Cited

U.S. PATENT DOCUMENTS

| | | | |
|---|---|---|---|
| 2,466,849 | 4/1949 | Hood | 501/65 |
| 2,561,325 | 7/1951 | Duncan | 501/65 |
| 4,562,161 | 12/1985 | Mennemann et al. | 501/65 |
| 5,281,562 | 1/1994 | Araujo et al. | 501/65 |
| 5,403,664 | 4/1995 | Kurahashi et al. | 501/65 |
| 5,403,789 | 4/1995 | Kerko et al. | 501/65 |
| 5,480,846 | 1/1996 | Sundberg et al. | 501/65 |
| 5,702,996 | 12/1997 | Kawakami et al. | 501/14 |
| 5,710,082 | 1/1998 | Kawakami et al. | 501/65 |
| 5,747,395 | 5/1998 | Smith et al. | 501/65 |

*Primary Examiner*—Deborah Jones
*Assistant Examiner*—Cathy F. Lam
*Attorney, Agent, or Firm*—Ostrolenk, Faber, Gerb & Soffen, LLP

[57] ABSTRACT

An insulating paste comprises a glass component composed of $SiO_2$, $B_2O_3$ and $K_2O$ as $xSiO_2$-$yB_2O_3$-$zK_2O$, where x, y and z (% by weight) fall within the area surrounded by points A (x=65, y=35, z=0), B (x=65, y=20, z=15), C (x=85, y=0, z=15) and D (x=85, y=15, z=0), and an organic vehicle. The insulating layer made of the paste has a low dielectric constant and excellent insulating properties.

3 Claims, 1 Drawing Sheet

INSULATING PASTE AND THICK-FILM MULTI-LAYERED PRINTED CIRCUIT USING THE PASTE

This is a division of application Ser. No. 08/627,444, filed Apr. 4, 1996 now U.S. Pat. No. 5,766,741.

BACKGROUND OF THE INVENTION

1. Field of the Invention

The present invention relates to an insulating paste, which contains glass having a low dielectric constant as the insulating component and from which a thick-film insulating layer is formed by printing, and also relates to a thick-film multi-layered printed circuit having insulating layers made of the paste.

2. Description of the Related Art

With the increase in the density of electronic devices and in the processing speed of them, it is desired to lower the dielectric constant of the insulating layers used in the thick-film multi-layered printed circuits thereof.

In general, the insulating layers of a thick-film multi-layered printed circuits are formed by applying a glass paste onto a substrate followed by firing. Conventionally, materials including crystalline glass or amorphous glass such as $Al_2O_3$—$B_2O_3$—$SiO_2$ glass or the like, having a specific dielectric constant of 10 or so, along with a heat-resistant filler are used to form the insulating layers.

The conventional thick-film multi-layered printed circuits having insulating layers made of amorphous glass are obtained by firing an insulating layer of amorphous glass along with a thick-film conductor layer and a thick-film resistor layer which are on or under the insulating layer, at about 850° C. Therefore, the interlayer diffusion of the components constituting the insulating layer of amorphous glass, the thick-film conductor layer and the thick-film resistor layer occurs during the firing and causes various problems in that the characteristics of the layers become degraded. Specifically, the insulating resistance of the insulating layer is lowered, the wiring resistance of the thick-film conductor layer is increased, and the resistance value and the resistance-temperature coefficient of the thick-film resistor layers are varied.

SUMMARY OF THE INVENTION

The present invention can solve the above-mentioned problems and is intended to provide an insulating paste having a low dielectric constant and excellent insulating properties, which can be suitably used to form insulating layers in thick-film multi-layered printed circuits without increasing the wiring resistance of the thick-film conductor layers in circuits and without varying the resistance value and the resistance-temperature coefficient of the thick-film resistor layers therein, and also to provide a thick-film multi-layered printed circuit having an insulating layer made of the paste.

In order to attain the above-mentioned object, the insulating paste of the present invention includes a glass component composed of $SiO_2$, $B_2O_3$ and $K_2O$, and an organic vehicle. The composition ratio of the glass component is denoted as $xSiO_2$—$yB_2O_3$—$zK_2O$, where x, y and z indicate the proportion in percent by weight of the constitutive components and fall within the polygon formed by points A (x=65, y=35, z=0), B (x=65, y=20, z=15), C (x=85, y=0, z=15) and D (x=85, y=15, z=0) in a ternary composition diagram.

The present invention also provides a thick-film multi-layered printed circuit in which the insulating layer includes the glass component.

DETAILED DESCRIPTION OF THE INVENTION

The insulating paste and the thick-film multi-layered printed circuit using the paste of the present invention are described hereinafter with reference to the drawings appended hereto.

Figure 1:
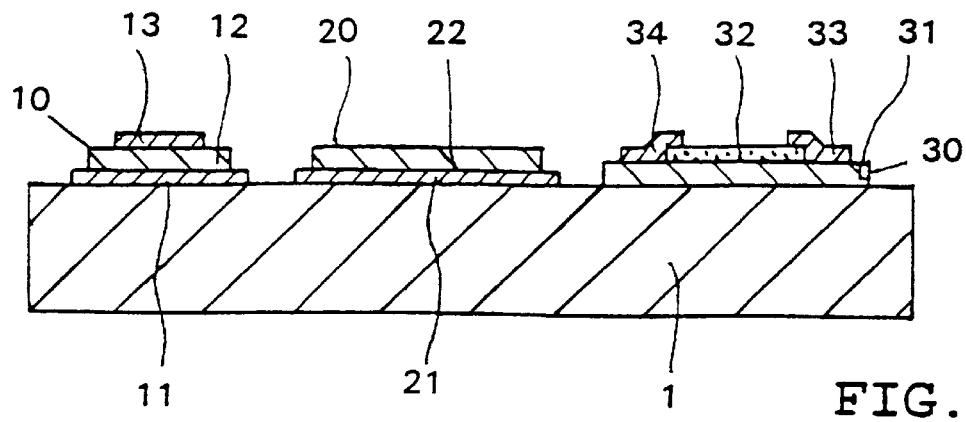
FIG. 1 is a cross-sectional view showing one embodiment of the thick-film multi-layered printed circuit of the present invention, which is used for evaluating its characteristics.

FIG. 1 is a cross-sectional view showing one embodiment of the thick-film multi-layered printed circuit of the present invention, which was prepared as described below and which was used for evaluating its characteristics. As shown in FIG. 1, a capacitor 10, a conductor 20, and a resistor 30 are formed on a substrate 1 as a part of the thick-film multi-layered printed circuit of the present invention. The capacitor 10 includes a pair of electrodes 11 and 13, and an insulating layer 12 interposed therebetween. The conductor 20 includes a fine wire 21 interposed between the substrate 1 and an insulating layer 22. The resistor 30 is formed on an insulating layer 31 and includes a $Ru_2O_3$-based resistor layer 32 and conductor layers 33 and 34. The conductor layers 33 and 34 are electrically connected to the resistor layer 32. The insulating layers 12, 22, and 31 are formed by coating and firing the insulating paste of the present invention. Although the capacitor 10 or the like is shown as a part of the thick-film multi-layered printed circuit of the present invention, it is appreciated that the thick-film multi-layered printed circuit is simplified and could include a plurality of stacked insulating layers and that the capacitor 10, conductor 20, resistor 30, or the like, could be formed in or on the plurality of stacked insulating layers.

Methods for producing the insulating paste and the thick-film multi-layered printed circuit of the present invention are described below.

First, an insulating paste was prepared. Specifically, $SiO_2$, $B_2O_3$ and $K_2O$, which are the raw materials for the glass component to be in the paste, were prepared. These were mixed to attain a series of the glass compositions as shown in Table 1 (with those outside of the invention indicated by *), and the resulting mixture was melted at a temperature between 1600° C. and 1750° C. to prepare a glass melt. Each glass melt was then rapidly quenched to a room temperature in the air and powdered to obtain a glass powder. Next, 40 parts by weight of an organic vehicle comprising an acrylic resin as dissolved in α-terpineol was added to 100 parts by weight of the glass powder and kneaded to prepare an insulating paste.

TABLE 1

| Sample Number | Glass Composition (wt. %) | | | Glass Softening Point (° C.) |
| --- | --- | --- | --- | --- |
| | SiO$_2$ | B$_2$O$_3$ | K$_2$O | |
| *1 | 60 | 30 | 10 | 700 |
| 2 | 65 | 35 | 0 | 680 |
| 3 | 65 | 20 | 15 | 720 |
| *4 | 70 | 10 | 20 | 710 |
| 5 | 70 | 28 | 2 | 720 |
| 6 | 75 | 23 | 2 | 760 |
| 7 | 79 | 19 | 2 | 800 |
| 8 | 83 | 10 | 7 | 950 |
| 9 | 85 | 0 | 15 | 1050 |
| 10 | 85 | 15 | 0 | 950 |
| *11 | 90 | 5 | 5 | >1050 |

Each insulating paste obtained as described was coated on a substrate and fired to prepare a thick-film multi-layered printed circuit having insulating layers made of the paste.

More specifically, an alumina substrate 1 was prepared, printed with an Ag paste by screen-printing and fired in air at 850° C. to form lower conductor layers 11 and 21 on the substrate 1. The layer 11 is one electrode for a capacitor and was in the form of a disc having a diameter of 8 mm, and the layer 21 is to measure the resistance of the conductor and had a length of 1.2 mm and a width of 100 μm. The resistance between the both terminals of the lower conductor layer was measured. Next, the insulating paste that had been prepared as explained above was applied by screen printing and fired in air at a temperature shown in Table 2 below, thereby forming a disc-like insulating layer 12 having a diameter of 6 mm on the lower conductor layer 11, forming an insulating layer 32 on the lower conductor layer 21 in such a manner that the both terminals of the lower conductor layer 21 were not coated by the layer 22 but were exposed, and forming, directly on the substrate, an insulating layer 31 on which a resistor layer was to be formed.

An Ru$_2$O$_3$-based resistance paste was next applied to the insulating layer 31 by screen-printing and then fired in air at 850° C. to form a resistor layer 32 on the layer 31. Three different resistance pastes having a sheet resistance of 20 Ω/square, 20 KΩ/square and 2 MΩ/square were used to form three different resistor layers.

An Ag paste was then applied by screen-printing and fired in air at 850° C., thereby forming an upper conductor layer 13 having a diameter of 4 mm, which is the other electrode of the capacitor, and forming upper conductor layers 33 and 34 which are the terminal electrodes at the both ends of the resistor layer 32. In such manner, thick-film multi-layered printed circuit samples were completed in order to evaluate their characteristics.

The characteristics of the capacitor comprising the lower conductor layer 11 and the upper conductor layer 12, as a pair of facing electrodes, and the insulating layer 12 as a dielectric layer were measured, on the basis of which the characteristics of the insulating layer 12 were evaluated. Precisely, the electrostatic capacitance and the dielectric loss (tan δ) were measured at a frequency of 1 MHz, a voltage of 1 Vrms and a temperature of 25° C., and the specific dielectric constant (e$_r$) was calculated from the electrostatic capacitance thus obtained and the dimension of the capacitor. In addition, a direct current (DC) of 100 V was applied to the capacitor sample for 1 minute, whereupon the insulating resistance (IR) of the sample was measured. Moreover, the resistance between the both terminals of the lower conductor layer 21 under the insulating layer 22 was measured, and then compared with the previously-measured resistance between the both terminals of the layer 21 not coated with the layer 22. From these data, obtained was the percentage of the variation in the resistance between the both terminals of the layer 21, which is referred to below as a percentage of the variation in the wiring resistance. The results thus obtained are shown in Table 2 below.

TABLE 2

| Sample Number | Baking Temp. (° C.) | Specific dielectric constant e$_r$ | Dielectric Loss tan δ (%) | Insulating Resistance Log IR (Ω) | Variation in Wiring Resistance (%) |
| --- | --- | --- | --- | --- | --- |
| *1 | 850 | 6.0 | 0.2 | >10 | 15 |
| 2 | 850 | 4.6 | 0.1 | >12 | 6.0 |
| 3 | 850 | 6.9 | 0.3 | >12 | 5.0 |
| *4 | 850 | 8.0 | 0.4 | >10 | 12 |
| 5 | 850 | 4.8 | 0.1 | >12 | −0.5 |
| 6 | 850 | 4.8 | 0.2 | >12 | 0.5 |
| 7 | 850 | 4.6 | 0.1 | >12 | −1.0 |
| 8 | 1000 | 6.2 | 0.3 | >12 | 0.5 |
| 9 | 1000 | 7.0 | 0.3 | >12 | 10 |
| 10 | 950 | 4.0 | 0.1 | >12 | 9 |
| *11 | 1000 | Formation of layers was impossible. | | | |

The resistance value and the resistance-temperature coefficient of the resistor 32 in Sample No. 1 and Sample No. 7 were measured. Fifty sample resistors for each sample number were measured at 25° C., and the mean resistance value of the 50 samples and the deviation of the resistance values measured were calculated. The deviation (CV) of the resistance values measured is represented by:

$$CV = \{[\text{standard deviation of samples}]/[\text{mean resistance value}]\} \times 100(\%)$$

The resistance-temperature coefficient is represented by a variation in the resistance between 25° C. and 150° C. (HTCR) and a variation in the resistance between 25° C. and −55° C. (CTCR), in units of ppm/° C., as based on the resistance value at 25° C. as the standard.

Two comparative samples were also prepared, and their resistance characteristics were compared with those of the samples of the present invention. Concretely, a comparative sample A was prepared which was the same as the above-mentioned samples of the present invention except that an Al—B—Si-based crystalline glass paste was used as the insulating paste to form the resistor 30. A comparative sample B was also prepared, which was the same as the above-mentioned samples of the present invention except that the resistor layer was directly formed on the alumina substrate without forming the insulating layer between the substrate and the resistor layer. The resistance values and the resistance-temperature coefficients of the two comparative samples A and B were measured in the same manner as above. The results of the resistance characteristics thus determined are shown in Table 3 below.

TABLE 3

| Sheet | Resistor Characteristics | | | |
|---|---|---|---|---|
| Resistance Value of Resistance | | Resistance Value | | Resistance-Temperature Coefficient |
| Paste Used ($\Omega$/square) | Mean Value ($\Omega$) | CV (%) | HTCR | CTCR (ppm/° C.) |
| Sample No. 1* | 20 | 20.8 | 18 | 223 | 572 |
| | 2K | 8.2K | 15 | 518 | 324 |
| | 2M | 16.2M | 12 | −349 | −546 |
| Sample No. 7 | 20 | 10.5 | 8.1 | 70 | 26 |
| | 2K | 0.73K | 2.9 | 162 | 122 |
| | 2M | 0.98M | 5.5 | 25 | −80 |
| Comp. Sample A (Al—B—Si-based glass) | 20 | 10.7 | 5.3 | 141 | 97 |
| | 2K | 1.1K | 4.2 | 63 | −5 |
| | 2M | 1.3M | 5.9 | −60 | −158 |
| Comp. Sample B (with no glass) | 20 | 9.4 | 5.9 | 58 | 4 |
| | 2K | 1.2K | 4.2 | 24 | −46 |
| | 2M | 2.4M | 8.6 | −98 | −201 |

According to the present invention, the glass component in the insulating paste is amorphous and has a low dielectric constant. When the paste is coated and fired on a substrate, the glass component in the paste causes little interlayer diffusion to the adjacent thick-film conductor layers or thick-film resistor layers. Therefore, the insulating layer made from the paste has excellent insulating properties and does not degrade the characteristics of the adjacent thick-film conductor layers and thick-film resistor layers.

More specifically, as is obvious from Tables 1 to 3 above, the insulating layers as formed by coating and firing the insulating paste of the present invention have a low specific dielectric constant that falls between 4.0 and 7.0. In addition, these insulating layers have excellent insulating properties in that the variation in the wiring resistance of the thick-film conductor layers formed adjacent to the insulating layers is not higher than 10%. The resistance values and the resistance-temperature coefficients of the thick-film resistor layers formed adjacent to the insulating layers made of the insulating paste of the present invention are almost comparable to those of the same thick-film resistor layers formed on the insulating layer of crystalline glass or formed directly on the alumina substrate. These results indicate that when the insulating paste of the present invention is used to form insulating layers in a thick-film multi-layered printed circuit on a substrate, the insulating layers and the adjacent thick-film conductor layers and thick-film resistor layers formed on the substrate are free from interlayer diffusion of the components constituting the individual layers and therefore the characteristics of the layers are not degraded.

Figure 2:
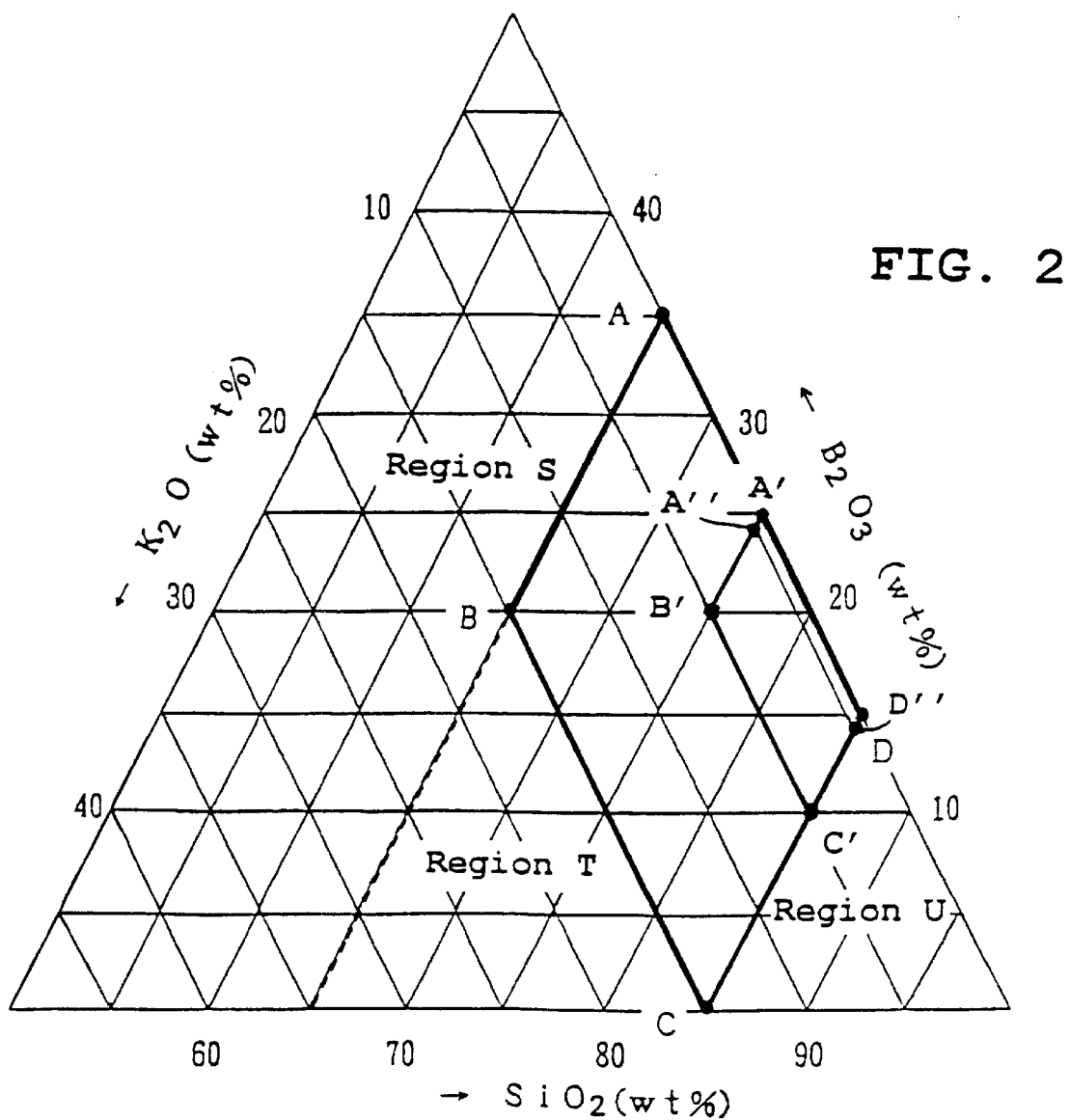
FIG. 2 is a ternary compositional diagram showing the composition range of the glass component of the insulating paste of the present invention.

Hereinafter, a preferable composition range of the glass component in the insulating paste of the present invention is explained. As shown in FIG. 2, in the case where the ratio of $SiO_2:B_2O_3:K_2O$ is denoted as x:y:z with the units being weight percent, it is preferable that the ratio is within the range surrounded by points A (x=65, y=35, z=0), B (x=65, y=20, z=15), C (x=85, y=0, z=15) and D (x=85, y=15, z=0).

In addition, it is more preferable that the ratio is within the range surrounded by points A' (x=75, y=25, z=0), B' (x=75, y=20, z=5), C' (x=85, y=10, z=5) and D (x=85, y=15, z=0). This is because the insulating layer prepared from the insulating paste having the ratio within this range has a lower dielectric constant due to decreasing the amount of $K_2O$ and improved durability for humidity due to decreasing the amount of $B_2O_3$.

In order to improve the durability for humidity, it is more preferable that the ratio is within the range surrounded by points A" (x=75, y=24.5, z=0.5), B' (x=75, y=20, z=5), C' (x=85, y=10, z=5) and D" (x=85, y=14.5, z=0.5).

In the case where the ratio falls in the region S, i.e., x is less than 65, the insulating resistance of the insulating layer is low, for example, $1\times10^{10}$ $\Omega$ as in Sample No. 1 and the variation in the wiring resistance of the thick-film conductor layer is high, for example, 15% as in the same sample. Therefore, the ratio within the region S is unfavorable. In addition, the deviation (CV) of the resistance values of resistors in the region S is large and the resistance-temperature coefficients of resistors are large.

In the case where the ratio falls in the region T, i.e., z is more than 15 and y is more than 65, the specific dielectric constant of the insulating layer is high, for example 8.0 as in Sample No. 4, the insulating resistance thereof is lowered, for example, to $1\times10^{10}$ $\Omega$ as in the same sample, and the variation in the wiring resistance of the thick-film conductor layer is large, for example, 12% as in the same sample. Therefore, the ratio within the region T is unfavorable.

In the case where the ratio falls in the region U, i.e., x is more than 85, the glass softening point of the paste is high and the paste prepared therefrom could not form a film even when fired at 1000° C., as in Sample No. 11. Accordingly, the ratio within the region U is unfavorable.

In addition, the composition ratio of the glass components of the insulating paste is generally related to the value of the dielectric constant and the temperature at which the insulating paste can be fired. Therefore, in the case where it is required to obtain an insulating layer having a lower dielectric constant, the ratio is preferably within the range surrounded by points A (x=65, y=35, z=0), B (x=65, y=30, z=5), C (x=85, y=10, z=5) and D (x=85, y=15, z=0). In this case, the dielectric constant of 5 or less is obtained. On the other hand, in the case where the insulating paste will be fired about 850° C., the ratio is preferably within the range surrounded by points A' (x=75, y=25, z=0), B' (x=75, y=20, z=5), C' (x=84, y=16, z=0) and D' (x=84, y=11, z=5).

In the above-mentioned example, a solution of an acrylic resin dissolved in a-terpineol was used as the organic vehicle to be in the insulating paste, but this is not limitative. Apart from the organic vehicle employed hereinabove, ethyl cellulose resins, nitrocellulose resins, butyral resins and others are employable as the resin component, and alcohol solvents such as butyl Carbitol, etc., ester solvents such as butyl Carbitol acetate, butyrates, etc., and also kerosene and others are employable as the solvent component. If desired, a plasticizer such as phthalate esters, etc. can be added to the insulating paste of the present invention in accordance with the intended use thereof.

In the above-mentioned example, the insulating paste was fired in air. Apart from this, the insulating paste can also be fired in a neutral atmosphere (e.g., $N_2$) to attain the same effects as in the example.

The insulating paste of the present invention can be used not only in thick-film multi-layered printed circuits but also in single-layered circuits as an under-glaze to reduce fluctuation in the characteristic values of the resistors and the conductor wires in the circuits.

In the above-mentioned example where multi-layered, printed circuits were prepared, Ag was used as the conductor component. Apart from this, Cu, Ag/Pd, Ag/Pt, Au and others can also be used as the conductor component to attain the same effects as in the example.

In addition, other multi-layered, printed circuits having $LaB_6$-based resistor layers, apart from the $Ru_2O_3$-based resistor layers such as those in the above-mentioned example, also attain the same effects as in the example.

As has been described in detail hereinabove, when the insulating paste of the present invention is coated and fired on a substrate to produce a thick-film multi-layered printed circuit having insulating layers made of the paste, the insulating layers formed are amorphous and have a low dielectric constant. In addition, the wiring resistance of the thick-film conductor layers in the thick-film multi-layered printed circuit is not increased, the fluctuation in the resistance values of the thick-film resistor layers in the circuit and also the resistance-temperature coefficients of the thick-film resistor layers are not increased, and the insulating layers in the circuit has a high insulating property. Therefore, it is possible to produce thick-film multi-layered printed circuits having an increased density and a printed circuit pattern of low resistance, thereby increasing a speed of signals transmitted in the printed circuit pattern.

While the invention has been described in detail and with reference to specific embodiments thereof, it will be apparent to one skilled in the art that various changes and modifications can be made therein without departing from the spirit and scope thereof.

What is claimed is:

1. An insulating paste comprising a glass component consisting of $SiO_2$, $B_2O_3$ and $K_2O$, and an organic vehicle, wherein the composition ratio of the glass component is denoted as $xSiO_2$-$yB_2O_3$-$zK_2O$, where x, y and z indicate the proportions by weight percent of the constitutive components and fall within the area surrounded by the points A (x=65, y=35, z=0), B (x=65, y=20, z=15), C (x=85, y=0, z=15) and D (x=85, y=15, z=0).

2. An insulating paste according to claim 1 in which the constitutive components fall within the points A' (x=75, y=25, z=0), B' (x=75, y=20, z=5), C' (x=85, y=10, z=5) and D (x=85, y=15, z=0).

3. An insulating paste according to claim 1 in which the constitutive components fall within the points A" (x=75, y=24.5, z=0.5), B' (x=75, y=20, z=5), C' (x=85, y=10, z=5) and D" (x=85, y=14.5, z=0.5).

* * * * *